(12) United States Patent
Yamaguchi et al.

(10) Patent No.: US 7,317,207 B2
(45) Date of Patent: Jan. 8, 2008

(54) SEMICONDUCTOR DEVICE, METHOD OF MAKING THE SAME AND LIQUID CRYSTAL DISPLAY DEVICE

(75) Inventors: Shinya Yamaguchi, Mitaka (JP); Masanobu Miyao, Fukuoka (JP); Nobuyuki Sugii, Tokyo (JP); Seang-kee Park, Hachioji (JP); Kiyokazu Nakagawa, Kofu (JP)

(73) Assignee: Hitachi, Ltd., Tokyo (JP)

( * ) Notice: Subject to any disclaimer, the term of this patent is extended or adjusted under 35 U.S.C. 154(b) by 36 days.

(21) Appl. No.: 11/146,016

(22) Filed: Jun. 7, 2005

(65) Prior Publication Data

US 2005/0230683 A1 Oct. 20, 2005

Related U.S. Application Data

(62) Division of application No. 09/698,274, filed on Oct. 30, 2000, now Pat. No. 6,903,372.

(30) Foreign Application Priority Data

Oct. 29, 1999 (JP) .................................. 11-309499

(51) Int. Cl.
*H01L 29/786* (2006.01)

(52) U.S. Cl. .................... 257/66; 257/64; 257/65; 257/66; 257/69; 257/70; 257/347; 257/72; 257/59; 257/E21.413; 257/E21.414; 257/E29.117

(58) Field of Classification Search ............... 257/59, 257/347–355; 438/149, 479, 517
See application file for complete search history.

(56) References Cited

U.S. PATENT DOCUMENTS

| 6,060,375 | A | 5/2000 | Owyang et al. |
| 6,291,852 | B1 | 9/2001 | Yano et al. |
| 6,348,368 | B1 | 2/2002 | Yamazaki et al. |
| 6,462,723 | B1 | 10/2002 | Yamazaki et al. |
| 6,545,294 | B1 * | 4/2003 | Yamaguchi et al. .......... 257/64 |
| 6,608,326 | B1 * | 8/2003 | Shinagawa et al. .......... 257/64 |
| 6,956,325 | B2 * | 10/2005 | Yamazaki et al. .......... 313/512 |

* cited by examiner

*Primary Examiner*—Sue A. Purvis
*Assistant Examiner*—Fazli Erdem
(74) *Attorney, Agent, or Firm*—Antonelli, Terry, Stout & Kraus, LLP.

(57) ABSTRACT

To provide TFT of improved low-temperature polycrystalline layer that has higher electron mobility and assures less fluctuation in manufacture in view of realizing a liquid-crystal display device having a large display area by utilizing a glass substrate.

A TFT having higher electron mobility can be realized within the predetermined range of characteristic fluctuation by utilizing the semiconductor thin-film (called quasi single crystal thin-film) formed of poly-crystal grain joined with the {111} twin-boundary of Diamond structure as the channel region (namely, active region) of TFT.

2 Claims, 14 Drawing Sheets

FIG. 6A
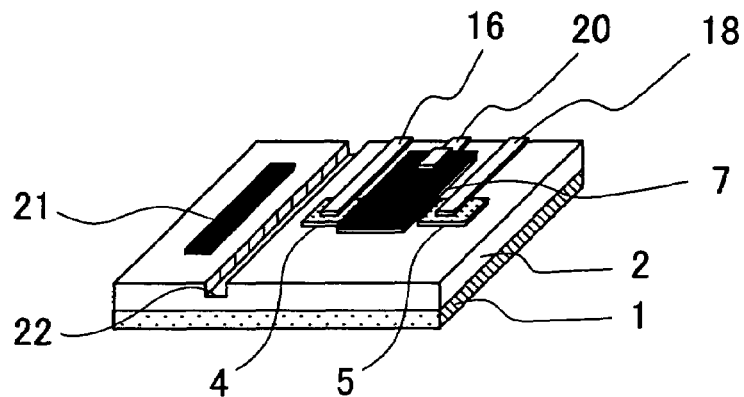
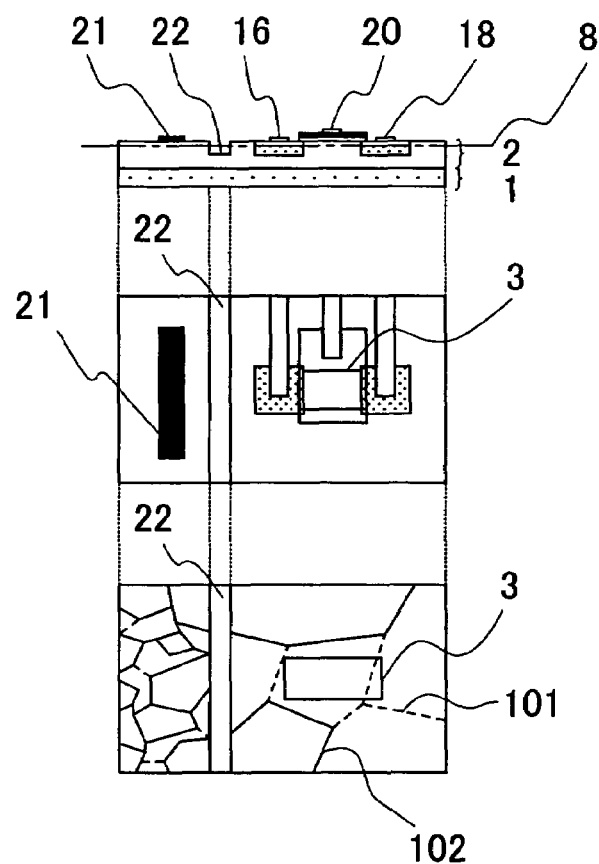
FIG. 6B
FIG. 6C
FIG. 6D

FIG. 7A
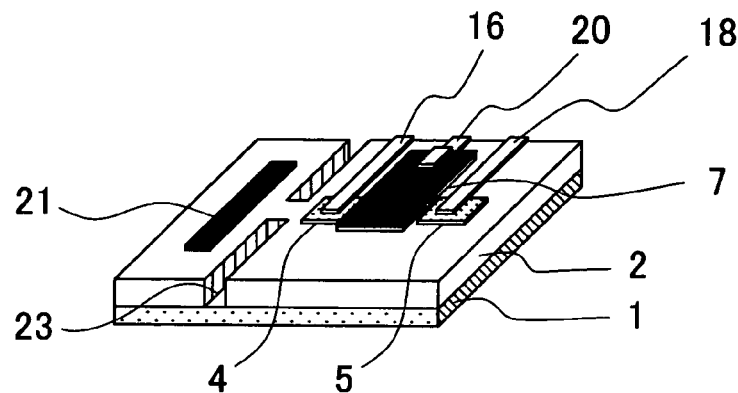
FIG. 7B
FIG. 7C
FIG. 7D
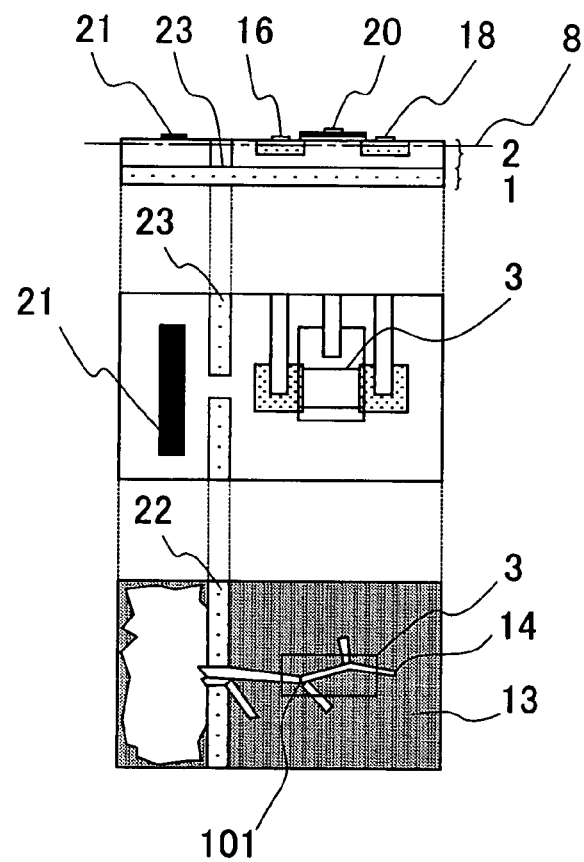

SEMICONDUCTOR DEVICE, METHOD OF MAKING THE SAME AND LIQUID CRYSTAL DISPLAY DEVICE

This application is a Divisional application of prior application Ser. No. 09/698,274, filed Oct. 30, 2000 now U.S. Pat. No. 6,903,372, the contents of which are incorporated herein by reference in their entirety.

BACKGROUND OF THE INVENTION

1. Field of the Invention

The present invention relates to a semiconductor device and particularly to a thin film semiconductor device, a method of making the same and a liquid crystal display device using the same device.

2. Description of the Related Art

As the base material on which a thin film semiconductor device (a thin film transistor (TFT) principally used in an image display device) is formed, a high-temperature polycrystalline Si (silicon) has been mainly used. In this material, the polycrystalline Si (silicon) is formed on a quartz substrate through the high-temperature heat treatment under the temperature of about 900° C. and thereby the polycrystal Si of comparatively large grain size (200 to 500 nm) has been formed. A TFT formed on this high-temperature polycrystal Si uses a Si thin film having lower density of grain boundary and good crystallinity as the channel region and therefore it is possible to obtain the electron mobility of 100 to 150 $cm^2/(V \cdot s)$ which is approximated to that (about 500 $cm^2/(V \cdot s)$ of single crystal. However, since this high-temperature polycrystal Si is required to use an expensive quartz substrate that is resistive to high-temperature process, substrate cost makes it difficult to reduce the total cost of the device and thereby wide use of TFT has been restricted.

In these years, a low-temperature polycrystal Si has been investigated in place of such high temperature polycrystal Si. In the case of low-temperature polycrystal Si, amorphous silicon or micro crystalline silicon formed on a low cost glass substrate with the plasma CVD method or the like is crystallized with the melt-grown method such as excimer laser anneal. This method brings a merit that TFT can be attained at a very low cost because the polycrystalline Si thin film can be formed at the temperature lower than the glass softening temperature of about 450° C. However, the existing low-temperature polycrystalline Si has the smaller grain size than that of the high-temperature polycrystalline Si. Therefore the TFT using the low-temperature Si as the element material results in large carrier scattering at the grain boundary and has the electron mobility restricted to about 30 to 50 $cm^2/(V \cdot s)$. Such a small electron mobility cannot attain the required element velocity and therefore results in a problem that the elements that can be formed on a sheet of glass substrate are restricted in the kinds thereof. For instance, in the case of the image display apparatus, the matrix element may be formed on the glass but the peripheral circuits such as the other source driver, gate driver, shift register and peripheral controller are formed on the printed circuit board and this board must be used through connection to the glass substrate with cable terminals. The method explained above has the problems that the display size is reduced (4-inch to 10-inch) and total cost of the apparatus becomes high.

On the other hand, recently, various techniques have been proposed to allow large grain size for the low-temperature polycrystalline Si and control the position of the crystal grain. For example, the technique (Japanese Unexamined Patent Publication No. H8-316485) to form seed crystal constituted of island type pattern on an insulator substrate and to realize solid-phase crystallization of amorphous Si on such core, the method (H8-31749) to form a deposited layer of amorphous Si on polycrystalline-Si and convert the polycrystalline-Si exposed at the surface to the next seed crystal, the method (H10-55960) to selectively make amorphous layer from the partially crystallized Si thin-film with ion implantation and then realize crystal growth again using the remaining crystal part as the nuclei, the method (H9-27452) to disperse metal element that accelerate crystallization of Si into the amorphous Si film under a high-temperature condition to crystallize the amorphous Si film, the method (H10-97993) to change in the step-like manner the fluence and pulse width of laser anneal, and the method (H8-288515) to form a first amorphous Si film on the insulated substrate forming the step areas, to form a first polycrystal-Si film having uniform orientation at the surface of step area side through the heat treatment of 24 hours, thereafter to conduct again the heat treatment of 24 hours for the second amorphous Si film formed thereon in order to form the second polycrystal-Si film having large gain size that is controlled in both alignment and crystal gain boundary.

However, although various attempts have been conducted, the crystallization method explained above to attain large crystal grain size still cannot obtain the low-temperature polycrystal-Si having good crystallinity with good reproducibility and various problems are yet left unsolved for mass-production. For instance, the crystal grain size is increased but fluctuation of characteristic among TFT elements due to the position deviation of crystal grain cannot be controlled. Moreover, surface orientation of poly-crystal is formed at random and therefore here rises a problem that electron mobility depending on the surface alignment is fluctuated among the TFT elements. Accordingly, large influence is applied to the manufacturing yield of a large-scale thin-film semiconductor integrated circuit device formed by integrating many pieces of TFT. Particularly, it is very difficult to adopt such TFT to mass-production of a liquid-crystal display device having a large display area. Moreover, the existing crystallization process to control the alignment and position of grain boundary requires the long-term process. Therefore, mass-production thereof is always accompanied with increase of manufacturing processes, fluctuation of characteristic and drop of manufacturing yield, etc. and these are serious problems for realization of the liquid-crystal display device having a large display area of 15-inch or more.

SUMMARY OF THE INVENTION

The present invention provides a structure of a semiconductor device such as TFT and a method of manufacturing the same device based on the unique concept that is quite different from that of the devices of the related art.

As explained above, the approach of the related art can be found in the processes that the grain size of the crystal of polycrystal-Si is increased to suppress the grain, boundary as much as possible in order to avoid the influence of grain boundary to the electrical property and thereby such grain boundary is used as the active region of the TFT element. On the other hand, unlike the related art, the present invention has been proposed based on the quite novel approach that can be found in positively using the crystal gain boundary itself particular to the poly-crystal as the active region. In other words, focusing on that a plurality of crystal grains may be bonded under the joining condition having no mutual dangling bond in the {111} twin of the Diamond structure, the semiconductor area formed of poly-crystal grain joined in this twin boundary (grain boundary) will be used as the channel part forming the active region of a semiconductor device such as TFT or the like.

BRIEF DESCRIPTION OF THE DRAWINGS

FIGS. 6A through 6D are diagrams for explaining the essential portion of the TFT of the present invention.

FIGS. 7A through 7D are diagrams for explaining the essential portion of the other TFT of the present invention.

DETAILED DESCRIPTION OF THE PREFERRED EMBODIMENTS

Figure 1A:
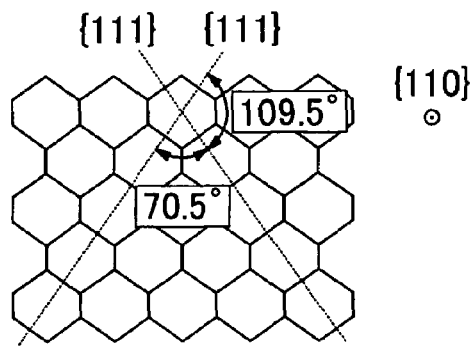
FIGS. 1A through !C are plan views of the surface of Si thin-film, namely the plan views of the channel part where the alignment condition of crystal lattice of the channel part is enlarged.

The preferred embodiments of the present invention will be explained in detail with reference to the accompanying drawings. In the drawings, the like elements having the like functions are designated with the like reference numerals and the same explanation is not repeated.

Prior to explanation about the preferred embodiments, the {111} twin will be explained. In this specification, the orientation family that is crystalographically similar such as surface orientations (110), (101) and (011) is described as {110}. Therefore, the {111} twin includes all twins in the surface orientation equivalent to all (111)-orientation. Moreover, in the following explanation, silicon (Si) is used as an example to simplify the explanation but the same explanation will be adapted to the crystals of Type-IV element (C, Si, Ge, Sn, Pb) or the mixed crystal constituted of the mixture of these elements.

Figure 1B:
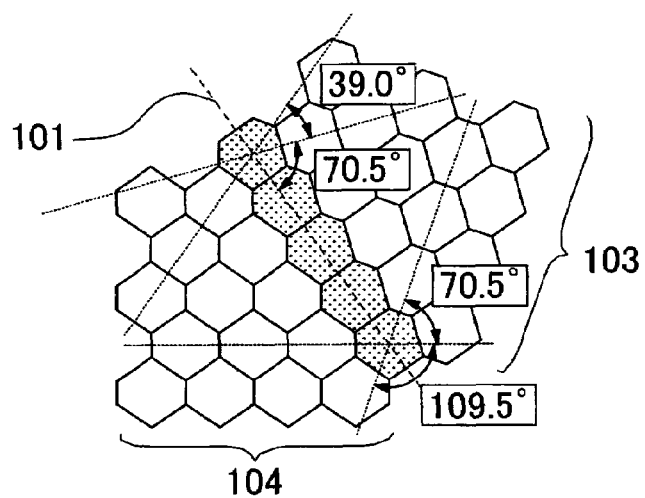
Figure 1C:
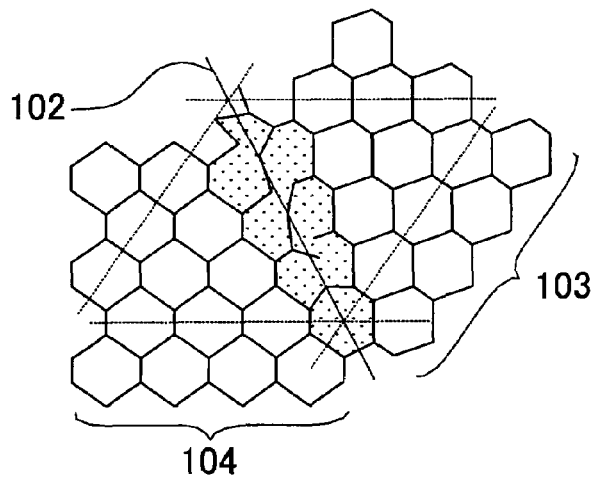

FIGS. 1A through 1C are plan views of the surface of Si thin-film, namely the plan views of the channel part where the alignment condition of crystal lattice is enlarged.

FIG. 1A illustrates the crystal lattice of single crystal Si for the comparison with the present invention and is illustrated in such a manner that the paper surface and the {110}-plane become parallel (also same in the subsequent figures). In the single crystal Si, a couple of equivalent {111}-planes exist as indicated with the dotted lines and these are crossing with each other in the acute angle of 70.5° (or obtuse angle of 109.5°).

FIG. 1B illustrates the crystal lattice near the Si {111} twin-boundary 101 of the present invention. When the crystal grain 103 is bonded with the gradient of 70.5° for the crystal grain 104, the {111}-planes of these crystal grains are well matched to form the grain boundary without generation of the dangling bond. Only the crystal plane of {111} realizes such well matching in the sufficiently wider area to form the channel in the Diamond structure.

FIG. 1C illustrates the crystal lattice near the non-twin-boundary 102 of Si. When the crystal grain 103 and crystal grain 104 are coupled in the angle other than 70.5° explained above, many crystal defects, crystal strain and dangling bond are generated in the grain boundary. These disturbances work as scattering potential to reduce the mobility of electrons passing through the channel. In the case of ordinary poly-crystal, this grain boundary scatting becomes the main factor for reduction of mobility and lowers the mobility in the single crystal of about 500 [cm$^2$/Vs] to 30 to 50 [cm$^2$/Vs].

On the other hand, meanwhile, in the case of the {111} twin-boundary 101 illustrated in FIG. 1B, defect, strain and dangling bond do not exist and only the density is lowered a little due to drop of a degree of symmetry of lattice and therefore when the ideal {111} twin can be attained, the electron mobility of about 350 to 500 [cm$^2$/Vs] which is almost equal to that of single crystal can be realized.

FIGS. 2A through 2G respectively list the patterns (crystal lattice diagrams) formed over a plurality of crystal grains among the twin-boundary 101 of the present invention.

Figure 2A:
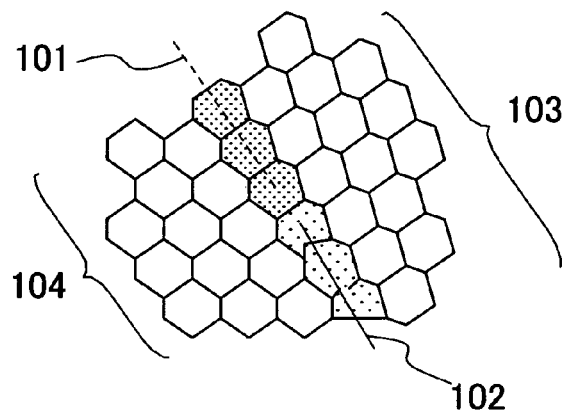
FIGS. 2A through 2G are plan views of the channel part illustrating the enlarged alignment condition of the crystal lattice at the surface of Si thin-film of the present invention.

When the twin-boundary 101 between a couple of crystal grains 103 and 104 is intermitted as illustrated in FIG. 2A, the remaining grain boundary becomes the non-twin-boundary 102 of FIG. 1C. In the present invention, it is preferable that such non-twin-boundary does not exist in the channel but, from the viewpoint of the principle of the present invention, it is enough when at least one of the source electrode and drain electrode exits so that the current path coupled to the channel forming part with the twin-boundary 101 can be connected with the source electrode and drain electrode and it is also enough when the non-twin-boundary 102 partially exists in the poly-crystal thin-film, because concentrated carrier flows like electrons through the current path having smallest resistance (in other words, small scattering potential) in the channel part of TFT and thereby the upper surface of the twin-boundary 101 becomes the channel in the figure and influence of non-twin-boundary 102 is not almost applied. Direction of the non-twin-boundary 102 may be determined freely and a plurality of non-twin boundaries 102 may be multiplexed.

Figure 2B:
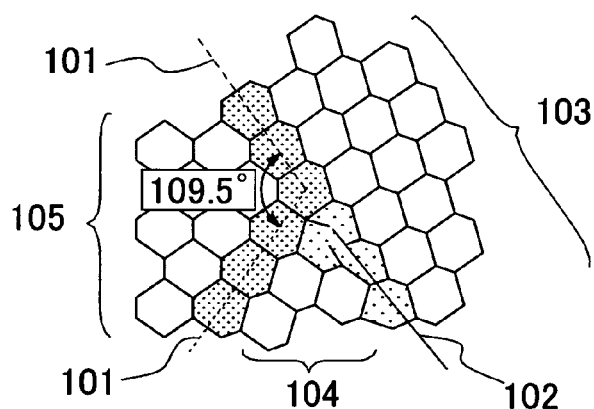

As illustrated in FIG. 2B, since three crystal grains 103, 104, 105 are joined and a couple of twin grain boundaries 101 of the present invention are coupled in the angle of 109.5° the crystal grains 103 and 104 may be coupled with the crystal grain 105 and twin boundary 101 forming the matching lattice. Therefore, it is possible to form the current path having good characteristic of the present invention. However, in this case, the non-twin-boundary 102 always exists in the path extending to the crystal grain 105 from 103 via 104. In this case, electron mobility of the current path between the crystal grains 103 and 104 via the crystal grain 102 is lowered but since the crystal grains 103 and 105 and the crystal grains 105 and 104 are joined with the twin-boundary, good channel of the present invention can be formed as in the case of FIG. 2A within the range of fluctuation of the electrical property of element. The structure of this figure is formed at all bending points having the angle of 109.5° of the twin-boundary 101.

Figure 2C:
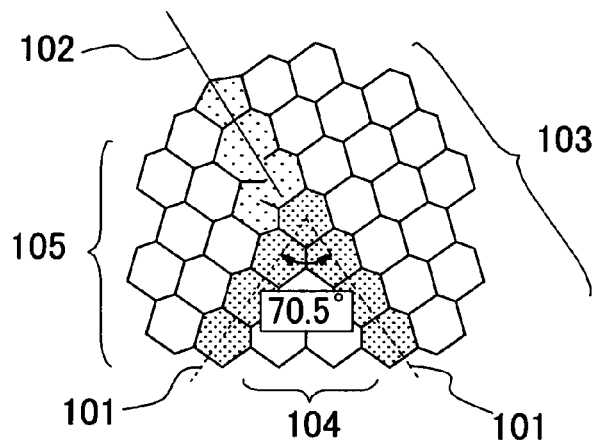

FIG. 2C illustrates the two twin grain boundaries 101 of the present invention that are coupled in the angle of 70.5° as the other structure applied to the joining of three crystal grains. This structure provides also the effect similar to that of FIG. 2B. The bending points of the twin-boundary 101 of the present invention have the two kinds of angles of 109.5° and 70.5°.

Figure 2D:
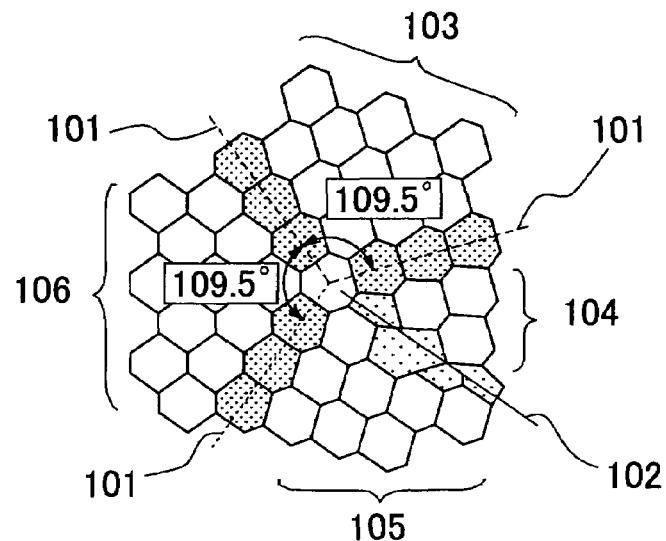

FIG. 2D illustrates an example of structure of the continuous matching lattice over the four crystal grains because three twin grain boundaries 101 of the present invention are coupled in the angle of 109.5° in the joint of the four crystal grains 103, 104, 105, 106. However, this case is always accompanied with the non-twin-boundary 102 as in the case of FIG. 2B.

Figure 2E:
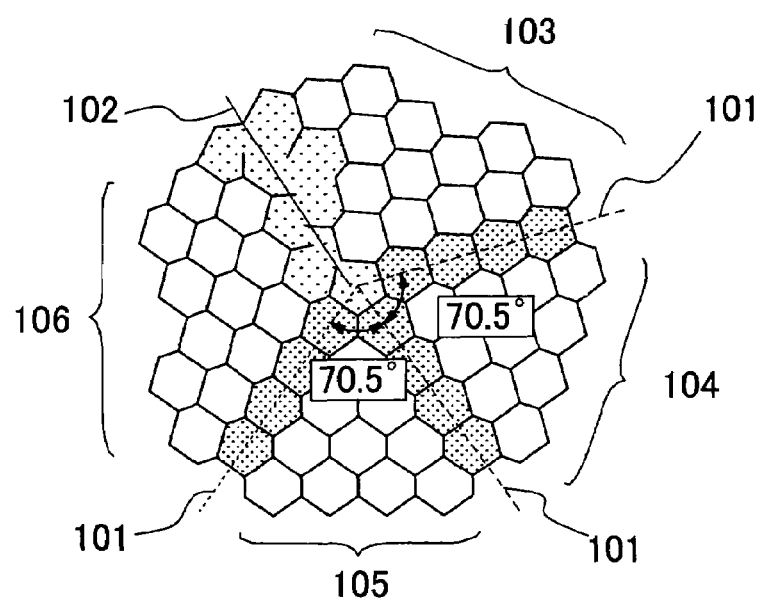

As illustrated in FIG. 2E, as the joint structure of four crystal grains, the twin-boundary 101 of the present invention is coupled in the angle of 70.5°. This figure illustrates an example where three twin grain boundaries 101 are all coupled in the angle of 70.5° but it is also allowed that only one angle becomes 109.5°. This case also provides the effect similar to that of FIG. 2D. The bending point of the twin-boundary 101 in the joint of four crystal grains of the present invention is found only in this structure and in the structure of FIG. 2D.

Figure 2F:
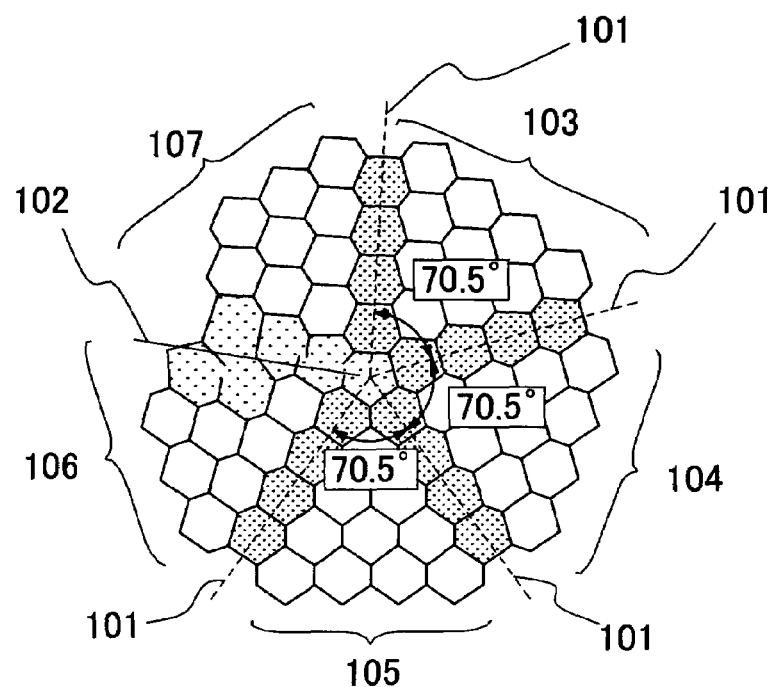

As illustrated in FIG. 2F, in the joint of the five crystal grains 103, 104, 105, 106, 107, the matching lattice over the five crystal grains can be formed by coupling four twin grain boundaries 101 of the present invention in the angle of 70.5°. However, this matching lattice is surely accompanied with the non-twin-boundary 102 as in the case of FIG. 2B.

Figure 2G:
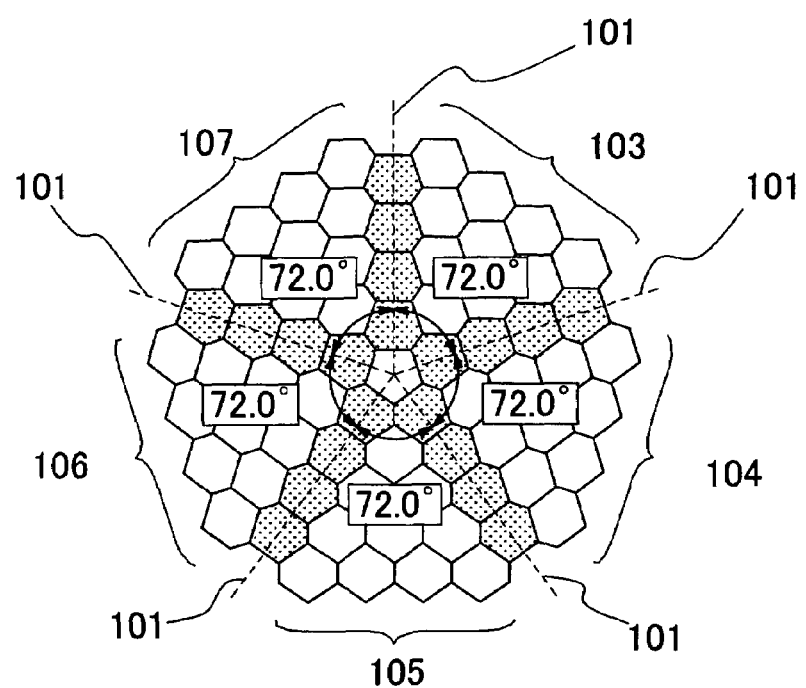

As illustrated in FIG. 2G, the continuous matching lattice over all of five particular crystal grains may be formed by coupling five twin grain boundaries 101 of the present invention in the angle of 72.0° in the joint of five crystal grains 103, 104, 105, 106 and 107. In this case, however, a tensile stress, for example, the intra-tensile-strain that becomes large as becoming far from the five multiplexed points is generated in the area near the five multiplexed points in comparison with the case where the coupling angle is 70.5°. In the case of this structure, all crystal grains may be operated as the channel.

Various kinds of current paths wherein a plurality of crystal grains are joined with the twin boundaries have been explained above, but the poly-crystal semiconductor active region having the electron mobility as high as 260 to 500 [$cm^2/Vs$] as will be explained later can be obtained with good reproducibility even when the crystal grain size of poly-crystal is not so large by providing at least one current path to couple between the source and drain as explained above. Moreover, when the active region has the electron mobility of at least 260 [$cm^2/Vs$] or higher, many TFT elements and a thin-film integrated circuit device integrating such TFT elements can be manufactured with good manufacturing yield within a certain range of the characteristic range.

The preferred embodiments of the present invention will be explained below.

(Embodiment 1)

Figure 3A:
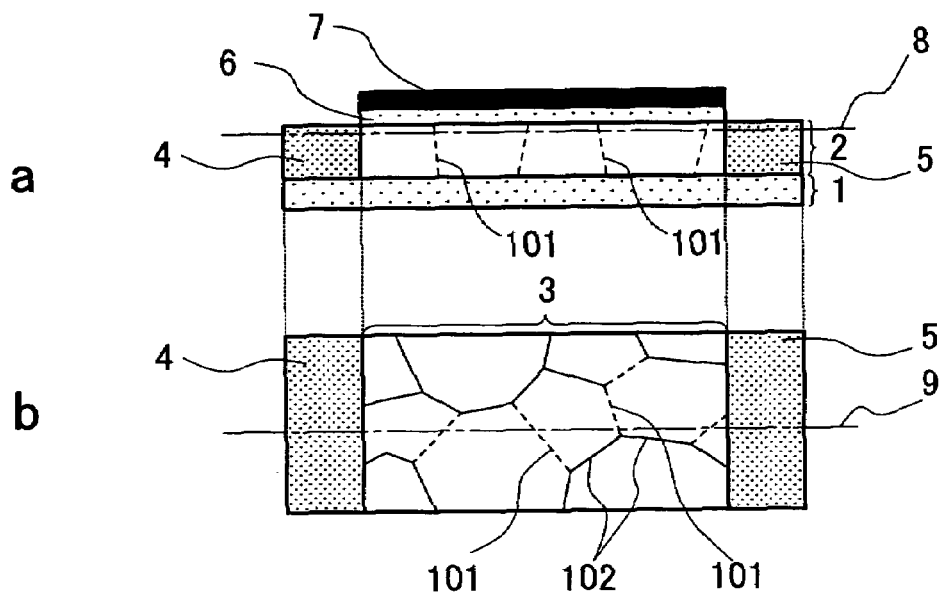
FIGS. 3A and 3B are diagrams for explaining the essential portion of TFT of the present invention.

FIG. 3A is a diagram for explaining the essential portion of a thin-film semiconductor device (TFT) as the first embodiment of the present invention. The upper drawing (a) of FIG. 3A is a cross-sectional view of the TFT along the cutting line 9 in the lower drawing (b) of FIG. 3B which is a plan view along the cutting line 8 in the upper drawing (a) of FIG. 3A indicating the channel part of TFT, namely the surface of the thin-film semiconductor layer (also similar to FIGS. 3B, 4A and 4B). A polycrystal-Si thin-film is formed in the thickness of 10 to 150 nm on an insulator substrate 1. This poly-crystal film 2 includes a source region 4, a drain region 5 and a channel part (length: about 5 μm; width: 2 to 3 μm) and a gate insulator 6 constituted of $SiO_2$ and a gate electrode 7 are formed on this channel part 3. The channel 3 just under the gate electrode is the active region of so-called field effect transistor that is operating in cooperation with this gate electrode and has the maximum current density. In this embodiment, the polycrystal-Si thin-film 2 is characterized as composed of a plurality of Si crystal grains joined with the {111} twin boundary 101 of the Diamond structure. When a current path coupling the source 4 and drain 5 is considered, the grain boundary crossing such current path is the twin-boundary 101 and when at least one current exists within the channel, the other grain boundary may be the non-twin-boundary 102. In this embodiment, a current flowing through the channel between the source and drain can be concentrated along the path by introducing such crystal structure and thereby scattering potential received from the non-twin-boundary 102 can be reduced extremely and high electron mobility similar to that of single crystal Si can be realized. In this sense, the inventors of the present invention calls the crystal formed of a plurality of crystal grains joined with this twin-boundary as "quasi single crystal".

In above explanation, at least one current path is formed of a plurality of crystal grains that are joined with the twin crystal boundary, but it is most preferable that almost entire part of the active region surface of the semiconductor layer just under the gate insulator is structured with a plurality of crystal grains joined with the twin crystal boundary as will be understood from above explanation.

(Embodiment 2)

Figure 3B:
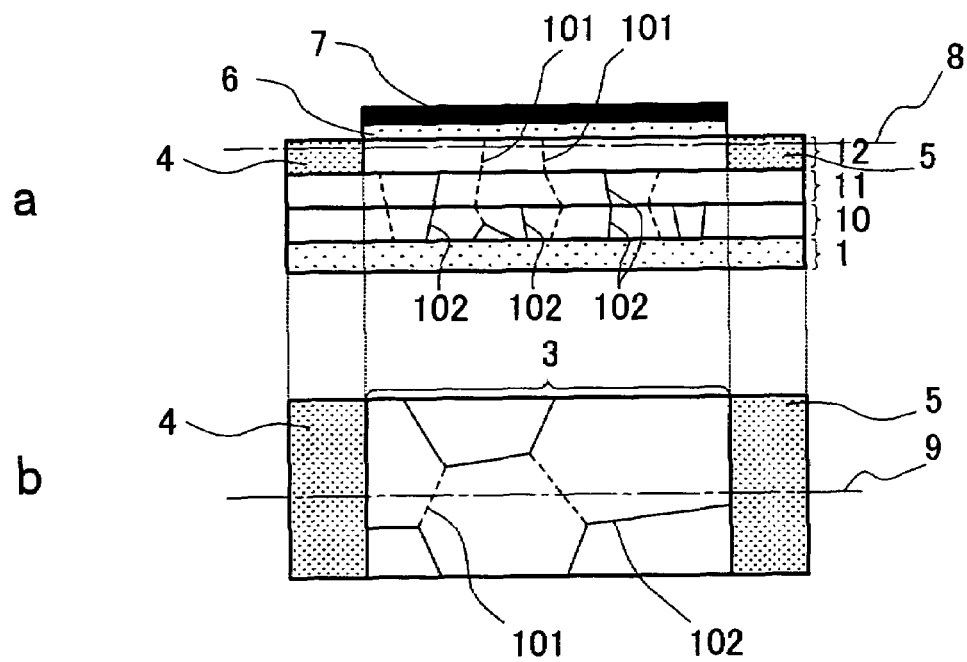

FIG. 3B is a diagram for explaining the essential portion of the thin-film -semiconductor device of the second embodiment of the present invention. This embodiment is characterized in providing many layers of polycrystal-Si thin-film (poly-crystal films 10, 11, 12) are formed in the thickness of 10 to 150 nm on the insulator substrate 1. Each layer is once deposited as amorphous and thereafter it is crystallized through the heat treatment. Thereby, such merits can be attained that grain boundary and crystal defect of the lower layers are not easily transferred to the upper layers and as a result the density of grain boundary becomes lower as the layer becomes higher. As is explained in regard to FIG. 3A, the channel having higher electron mobility than that in the single layer of FIG. 3A can be realized by converting almost entire part or all of grain boundary among the poly-crystal grains of the upper most layer 12 to the twin-boundary 101.

(Embodiment 3)

Figure 4A:
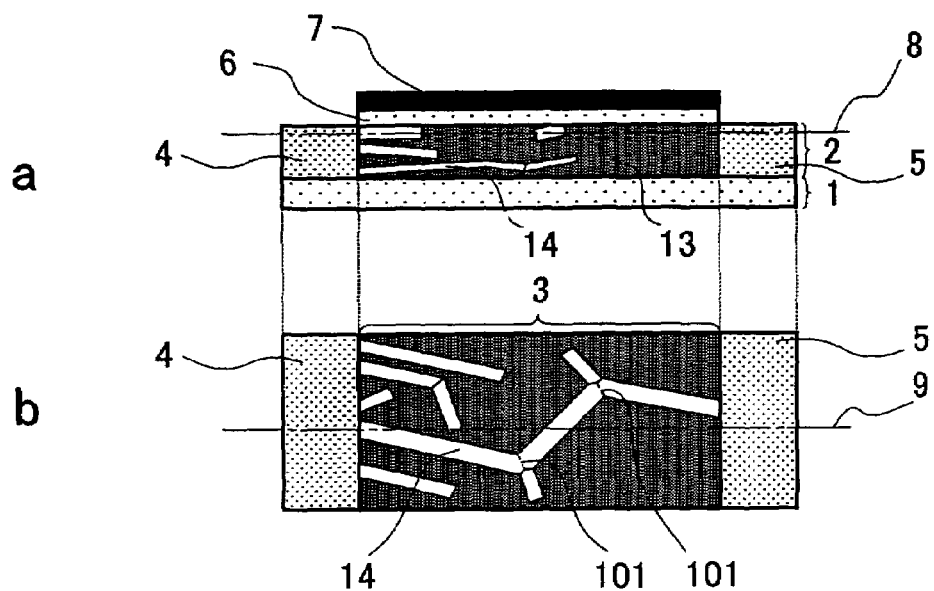
FIGS. 4A and 4B are diagrams for explaining the essential portion of the other TFT of the present invention.

FIG. 4A is a diagram for explaining the essential portion of the thin-film semiconductor device (TFT) of the third embodiment of the present invention. A Si thin-film 2 is formed in the thickness of 10 to 150 nm on the insulator substrate 1. This film 2 is formed of almost amorphous Si and includes a dendrite crystal 14 within the film. This branch crystal 14 is often extended in the lateral direction in the thickness thinner than the film thickness as illustrated in the figure. Moreover, it is also possible to control width and length of branch depending on the heat treatment condition such as temperature and time or the like. A longer crystal branch in this embodiment has the {110} plane almost parallel to the substrate surface and the {111} plane vertical to the longer axis of the branch and composed of one linear single crystal or a plurality of poly-crystal grains branching from the single crystal. However, in the case of branching, the branches are joined in any one of angles of 39.0°, 70.5° and 109.5° and the joint surface is almost formed of the twin-boundary 101. This thin-film 2 is provided with a source 4, a drain 5 and a channel 3 and on this channel 3, a gate insulator 6, a gate 7 are formed. When a current path coupling the source 4 and drain 5 is considered, this path becomes the bending line along the branch crystal 14, the grain boundary crossing such current path is almost twin-boundary 101 and at least one such path exists within the channel. When such a branch exists, the other channel part or Si layer may be left as the amorphous. This embodiment can realize, by concentrating the channel current to the path on the branch crystal 14, the TFT element having higher electron mobility corresponding to that of the single crystal Si by remarkably reducing the electron scattering potential received from the amorphous 13 or from non-twin-boundary 102.

(Embodiment 4)

Figure 4B:
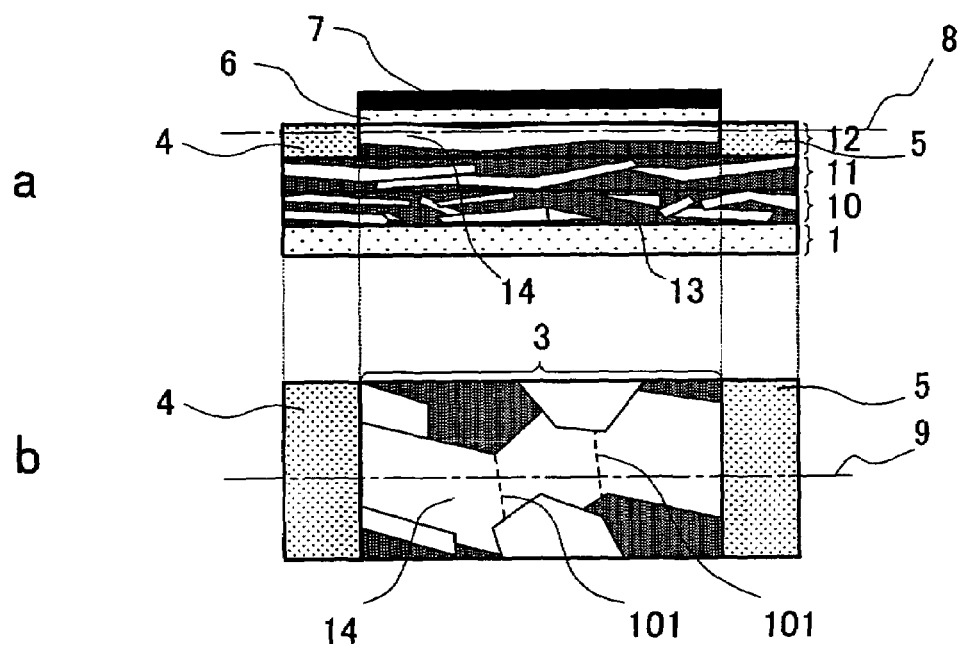

FIG. 4B is a diagram for explaining the essential portion of the thin-film semiconductor device of the fourth embodiment in the present invention. This embodiment is characterized in providing many layers of Si thin-film (films 10, 11, 12) formed in the thickness of 10 to 150 nm on the insulator substrate 1. Each layer is once deposited as amorphous and thereafter crystallized through the heat treatment. Thereby, following merits can be attained that grain boundary and crystal defect of the branch crystal 14 branching as many branches in the lower layer are not easily transferred to the upper layers and as a result, as the layer becomes upper layer, the wider branch crystal having better crystallinity may be formed. In a certain path on the branch crystal of channel 3, almost or all grain boundaries may be formed as the twin-boundary 101 by forming the source, 4, drain 5, gate insulator 5 and gate 7 on this high quality upper most layer 12 obtained as explained above.

(Embodiment 5)

FIGS. 5A through 5F are plan views for explaining the thin-film semiconductor device of the fifth embodiment in the present invention. These plan views of FIGS. 5A through 5F are illustrated corresponding to the arrangement patterns of the seed crystal metal.

Here, operation of the seed crystal metal will be explained first. Material of the seed metal in this embodiment is composed of metal M (any one or alloy thereof selected from Sc, Ti, V, Cr, Mn, Fe, Co, Ni, Cu, Zn, Ru, Rh, Pd, Ag, Os, Ir, Pt, Au) or compound MxAy (A is Type-IV element; x and y are mixed crystal ratio of M and A) of the metal M and Type-IV element or the laminated structure of the metal M and Type-IV element. First, Si thin-film is once formed as the amorphous film and the seed metal is then formed thereon. Thereafter, the heat treatment is performed. Thereby, the metal atom diffused from the seed metal becomes the core in Si and metal silicide seed is formed under the low temperature (about 450° C.). The seed metal may be deposited on the surface of Si thin-film or between the Si thin-film and insulation substrate. Moreover, a part of the Si thin-film may be substituted. The metal silicie formed has the property to form the crystal Si by sequentially fetching the amorphous Si. The metal silicide itself always exists at the interface between the amorphous and crystal and it continuously assists crystallization unless it is absorbed within the crystal defect. While the metal silicide is not consumed, crystallization progresses during the activation process that is determined by time and temperature toward the direction in which the seed metal advances. Crystallization can be realized in the area wider than the channel through the sufficiently longer heat treatment and thereby the polycrystalline layer thus obtained almost does not include the metal silicide and the orientation alignment can be almost uniformed in the twin-boundary. This embodiment utilizes the phenomenon explained above.

First, FIGS. 5A to 5C will be explained. Each drawing is the plan view of the surface of the thin-film semiconductor device of this embodiment. Each drawing illustrates that the source 4 is connected to the source wiring 15 via the source contact 15, while the drain 5 to the drain wiring 8 via the drain contact 17 and the gate 7 to the gate wiring 20 via the gate contact 19, respectively.

Figure 5A:
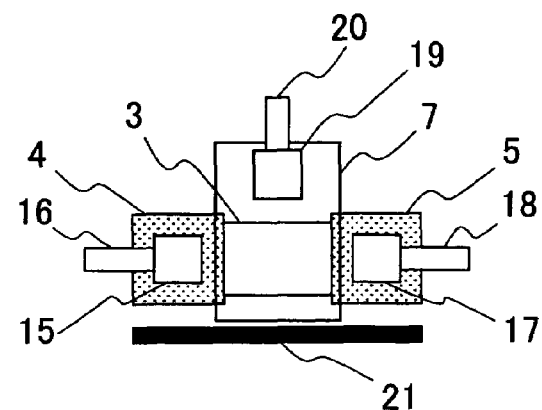
FIGS. 5A through 5F are diagrams for explaining the essential portions of various kinds of TFT of the present invention.

FIG. 5A: The seed metal 21 is formed, in parallel to the channel 3, on the semiconductor layer a little separated from the gate 7. Thereby, the seed metal 21 may be formed longer. For example, the channel 3 area can be uniformly crystallized within a short period of time by providing the seed metal layer for the length (L) of channel or for the length including the source • drain region.

Figure 5B:
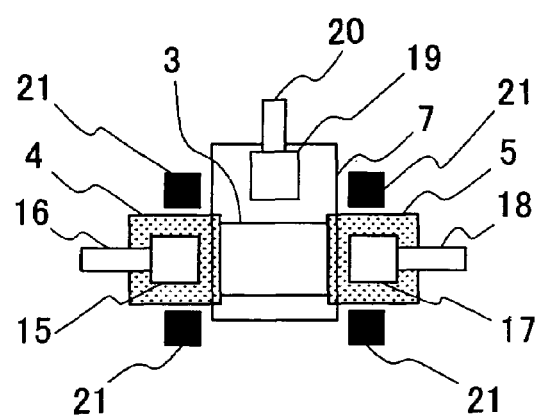

FIG. 5B: The seed metal 21 is dispersed in the various directions to surround the channel part 3. Thereby, the poly-crystal may be formed equally in the channel 3. As a result, fluctuation of transistor characteristic may be reduced. The seed metal 21 is formed in the external side of both ends of the source 4 and drain 5. This is the branch crystal extending from the seed metal 21. This branch crystal couples the source 4 and drain 5 and may be used as the channel.

Figure 5C:
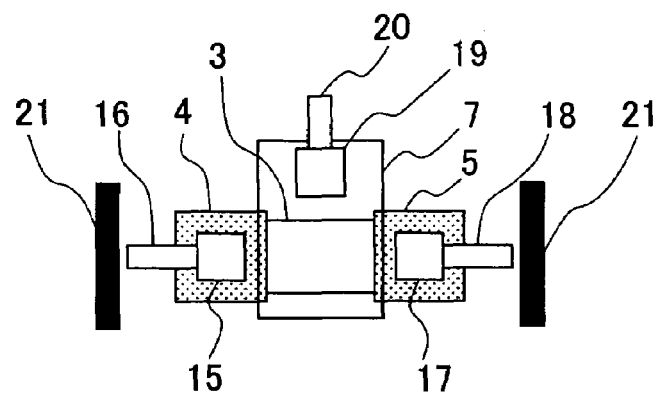

FIG. 5C: As will be understood from the explanation, in this embodiment, the seed crystal metal is not substantially provided on the channel part 3 but on the semiconductor layer other than the channel forming part (namely active region). Thereby, the crystal growth may be caused to progress toward the internal direction from the external circumference side of the channel part by making use of the thinner thickness of the semiconductor layer and accordingly the orientation alignment can be uniformed in the twin-boundary as explained above. On the other hand, when the crystal is grown from the vertical direction, namely from the film thickness direction of the semiconductor layer against the channel part, it is impossible to form the semiconductor layer having the poly-grain boundary in relation to the present invention.

Next, examples of the other arrangement pattern mainly aiming at shortening the heat treatment time for crystallization will be explained with reference to FIGS. 5D to 5F.

Figure 5D:
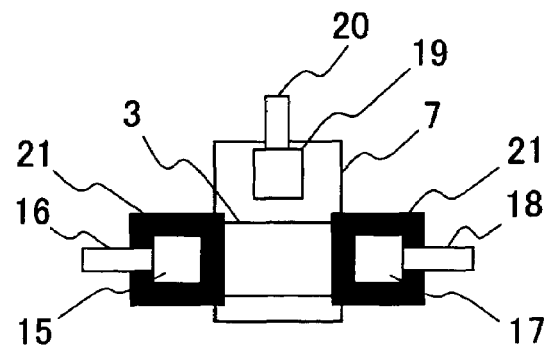

FIG. 5D: The source and drain are formed with the seed metal itself 21. This process will provide the merit that the forming process may be minimized but there rises a problem that the material that can realize correct ohmic contact is limited to the metals such as Ti, Ni, Pt, Au or the like. As a measure for this problem, it is considered to perform the crystallization process by providing the seed metal layer to this position and thereafter this metal layer is removed and an ordinary electrode material is deposited thereon.

Figure 5E:
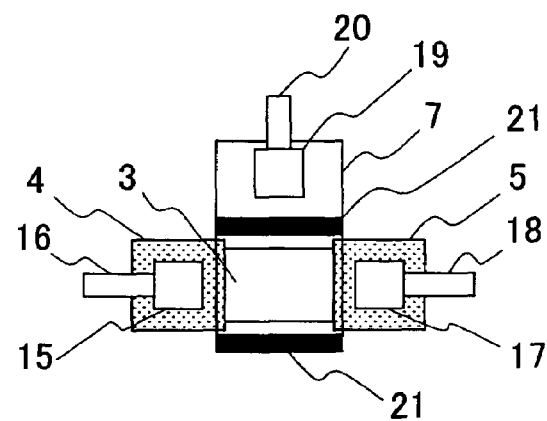

FIG. 5E: The seed metal 21 is formed just under the gate 7. This method has a merit that mounting size may be reduced and the channel 3 may be crystallized within a short period, but provides a fear for generation of leak current depending on the characteristic of gate insulator.

In this case, it is preferable, as in the case of FIG. 5D, to remove this metal layer after the crystallization process.

Figure 5F:
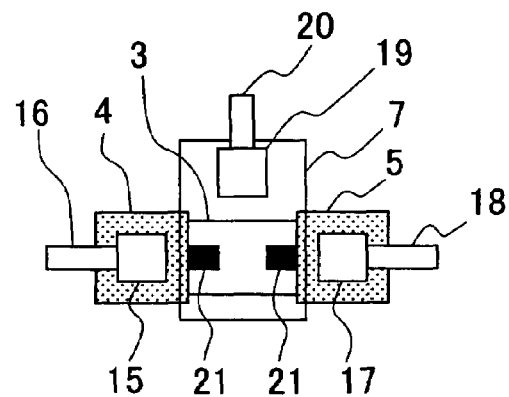

FIG. 5F The seed metal 21 is formed within or on the channel 3. This method has a merit that the time required for the crystal growth and mounting size can be minimized. In this example, since the crystal grows in the lateral direction to the peripheral area from the seed metal part as explained previously. However, like-the above process FIG. 5E explained above, there is a fear for generation of leak current depending on the characteristic of material.

(Embodiment 6)

FIGS. 6A through 6D are diagrams for explaining the thin-film semiconductor device of the sixth embodiment in the present invention. This embodiment is characterized in that a bottle-neck region (narrow region) 22 is provided between the seed metal 21 and channel 3, the narrow area is formed of the recess where a part of the polycrystalline layer 2 is erased or the area where a part is substituted with the other material, the cross-section of the Si thin-film 2 is set smaller than the other area in the bottle-neck region 22 and the seed metal 21 and the channel 3 are connected via the small cross-sectional area.

FIG. 6A is a perspective view of the semiconductor thin-film device of this embodiment. The bottle-neck region 22 is formed of the recess formed by digging a part of the Si thin-film 2. Namely, this bottle-neck region partially reduces the thickness or width of the semiconductor thin-film in comparison with the other part (namely, reduces the cross-sectional view). This effect can also be attained by forming the recess with the other material (for example, SiO$_2$ or the like due to the ordinary selective oxidation process using the silicon nitride film).

FIG. 6B is the vertical cross-sectional view of this thin-film semiconductor device. FIG. 6C is the plan view of the device, and FIG. 6D is the plan view of the Si layer surface at the cutting line 8 in FIG. 6B. The poly-crystal thin-film 2 is coupled, in the very thin condition, to a certain area of the seed metal 21 with the recess cut out by the bottle-neck region 22. When this polycrystalline layer 2 is once formed with amorphous and the heat treatment is conducted after the seed metal 21 is deposited, the crystal growth progresses from the seed metal 21 as explained above. Upon reaching the bottle-neck region 22, this crystal growth further progresses in the film under the thin bottle-neck region 22. But, if the growing crystal includes the crystal grains having the orientation a little different from that of the other part, such crystal grain reaches any one surface of the upper and lower surfaces thin this thinner film and thereby the growth stops.

Accordingly, the crystal grains having passed the bottle-neck region 22 are formed only of that having the uniform orientation alignment. Thereby, the crystallinity of crystal grains reaching the channel forming area 3 can be improved and as a result, the channel forming area 3 may be formed with the twin crystal boundary 101.

It is preferable to remain the bottle-neck region, even after the TFT element is formed, in order to use the upper part as the wiring area or to measure the electrical properties of the element.

(Embodiment 7)

FIGS. 7A through 7D are diagrams for explaining the thin-film semiconductor device of the seventh embodiment in the present invention. This embodiment is identical to the embodiment 6 explained above in the point that the bottle-neck region 23 is provided between the seed metal 21 and channel 3 and this bottle-neck region is formed of the recess where a part of the polycrystalline layer 2 is removed or of the area where a part is substituted with the other material.

FIG. 7A is a perspective view of this embodiment where only one path to the channel 3 from the seed metal 21 is left and all of the poly-crystal thin-films 2 up to the insulator substrate 1 are removed.

FIG. 7B is the cross-sectional view of the semiconductor device of this embodiment. FIG. 7C is a plan view of the device, and FIG. 7D is the plan view of the semiconductor layer surface at the cutting line 8 in FIG. 7B. The poly-crystal thin-film 2 is coupled, in the very narrow area, to a certain area of the seed metal 21 with the recess formed by the bottle-neck region 23. This polycrystalline layer 2 is once formed of amorphous and the seed metal 21 is then deposited. Thereafter, the branch crystal can be formed from the seed metal as explained above by conducting the heat treatment. Upon reaching the squeezed part 23, this crystal growth progresses within the narrow squeezed are 23. In this case, if the growing branch crystal includes the crystal grain that is different from the other crystal grains in the growing direction, the crystal reaches any one of the right and left walls within the narrow film and thereby crystal growth stops. Therefore, the branch crystal grain having passed the bottle-neck region 23 is formed only of the grains of the uniform growing direction. Thereby, following effects may be attained. Namely, direction of branch crystal reaching the channel 3 and the crystallinity may be improved and as a result, the channel 3 may be formed with the twin-boundary 101.

FIGS. 8A to 8H are cross sectional views for explaining the manufacturing processes of the thin-film semiconductor device of the present invention. As an example, the device comprises the seed crystal metal 21, bottle-neck region 22 and a plurality of polycrystalline layers 10 to 12.

Figure 8A:
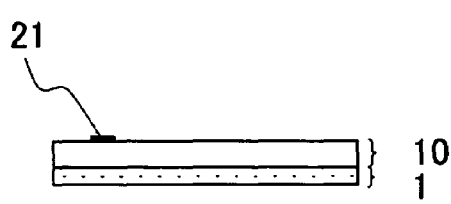
FIGS. 8A through 8H are diagrams for explaining the manufacturing process of TFT of the present invention.

FIG. 8A: An amorphous thin film 10 is formed in the thickness of about 50 nm by depositing Si on the insulator substrate 1 under the room temperature with the CVD method. On this thin film 10, the seed crystal metal 21 is formed in the thickness of 5 nm and width of 1 nm and length of 10 nm with the ordinary pattern forming process such as coating of resist, photomask exposure, developing, etching and vacuum evaporation. As this metal material, various metal materials may be used but in this embodiment, Nickel (Ni) is vacuum-evaporated.

Figure 8B:
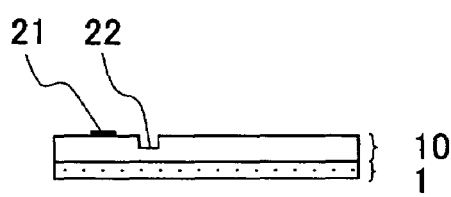

FIG. 8B: The bottle-neck region 22 is formed with the method similar to the pattern forming process explained above (however, vacuum evaporation is not performed). In this case, concentration of etchant and etching time are controlled to keep the depth of recess of the bottle-neck region 22 to about 3 to 4 nm. Distance between the bottle-neck region 22 and seed metal 21 is about 1 μm.

Figure 8C:
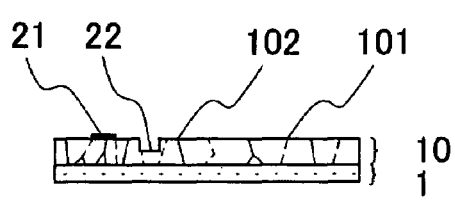

FIG. 8C: The heat treatment is performed for about 24 hours under the temperature of about 450° C. within the N$_2$ gas atmosphere for the purpose of crystallization of the thin-film 10. Thereby, crystallization occurs from the seed metal 21 for about 30 μm through the lower part of recess of the bottle-neck region 22. In this process, the preferable range of heating temperature is ranged from 360° C. to 600° C. and it is also possible to obtain the polycrystalline layer joined in the predetermined grain boundary of the present invention even with the short-term heat treatment within 10 hours, for example, about 5 hours by controlling the processing conditions.

Figure 8D:
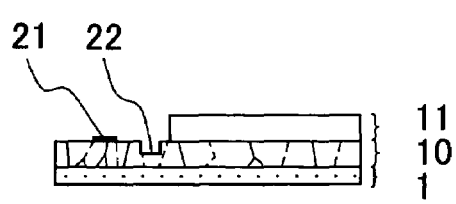

FIG. 8D: Subsequently, an amorphous Si thin-film 11 is formed with the same method as in FIG. 8A on this thin-film 10. In this case, the thin-film 11 is not placed in contact with the seed metal 21.

Figure 8E:
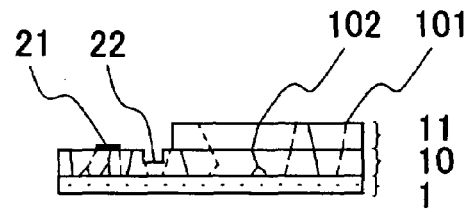

FIG. 8E: Thereafter, with the same method as in FIG. 8C, the thin-film 11 is crystallized. The thin-film 11 is crystallized from the interface of the lower thin-film 10, but since the crystal grain in the higher growth rate reaches quickly the surface and the crystal grain of the lower growth rate is prevented to grow with the other crystal grains and thereby cannot grow further. Therefore, each crystal grain at the area near the surface of thin-film 11 becomes large in size in comparison with that at the area near the surface of thin-film 10. Accordingly, density of the twin-boundary 11 and non-twin-boundary 102 becomes small and thereby the wider single crystal area can be attained.

Figure 8F:
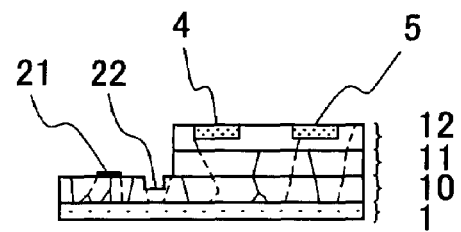

FIG. 8F: Moreover, the processes of FIG. 8D and FIG. 8E are repeated to form the poly-crystal thin-film 12 and the source 4 and drain 5 are also formed by implanting the ion of arsenic or boron and then carrier activation.

Figure 8G:
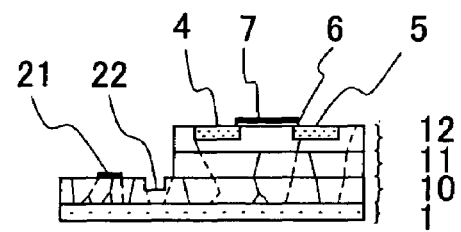

FIG. 8G: The surface of poly-crystal thin-film 12 is oxidized with the thermal oxidation method to form the gate insulator 6 and Al is deposited thereon with the pattern forming process in view of forming the gate 7.

Figure 8H:
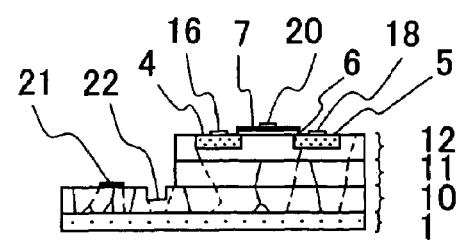

FIG. 8H: Finally, the thin-film semiconductor device is formed by respectively wiring the source contact 16, drain contact 18 and gate contact 20 with aluminum on the source 4, drain 5 and gate 7.

Moreover, in the manufacturing processes explained above, it is also possible to form the crystal grain of large size joining with the other crystal grains owing to the {111} twin by particularly controlling the conditions of crystallization process, for example, by setting the heating time to 24 hours or longer. However, increase of crystal size, namely increase of grain size is not so important, as explained above, for control of characteristic fluctuation among elements completed.

Figure 9A:
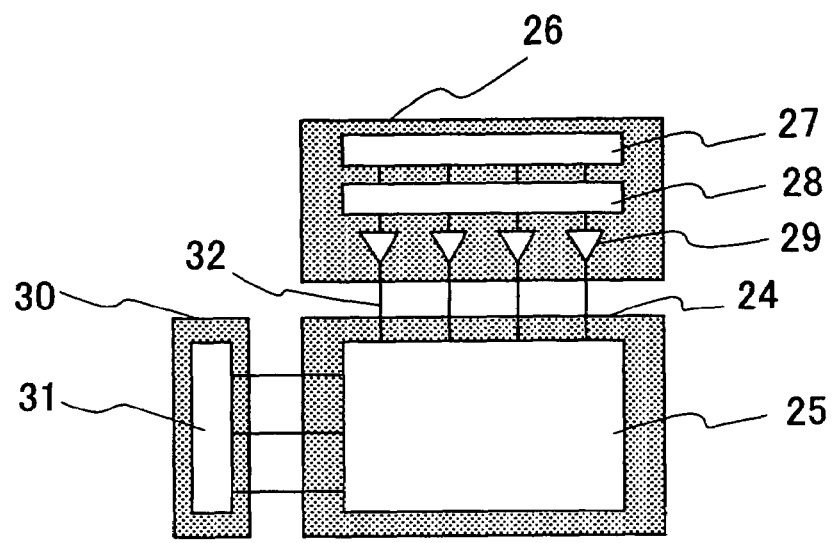
FIGS. 9A and 9B are schematic diagrams of an electronic apparatus for explaining the effect of the present invention.
Figure 9B:
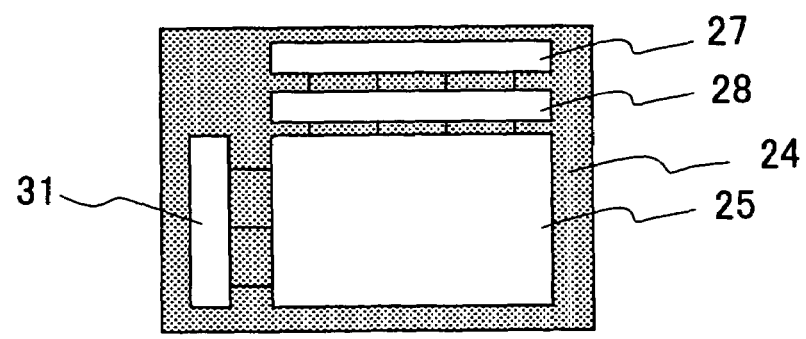

FIG. 9A and FIG. 9B are diagrams for explaining the merits attained by introducing the thin-film semiconductor device of the present invention.

FIG. 9A illustrates a plan view of the image display apparatus of the related art wherein the pixels 25 are formed using amorphous Si on the image display panel 25 of the quartz or glass substrate. The principal peripheral circuits used for data control such as shift register 27, digital/analog converter 28, buffer amplifier 29 are externally provided as the data drive 26 by attaching individual semiconductor package formed on the ordinary Si single crystal substrate to the ordinary circuit board and connection with the image display panel 24 has been realized through the connector 32. In the same manner, the peripheral circuits such as the shift register 31 for gate control and the gate driver 30 are also connected. Such structure is required because the operation rates required for the data driver 26 and gate driver 30 cannot be realized with the electron mobility of amorphous Si. This structure has a disadvantage that display area size is restricted and device cost increases.

FIG. 9B illustrates a plan view of a liquid crystal image display apparatus when the thin-film semiconductor device of the present invention is used. The principal circuits can be integrated on the glass substrate of large area with small electrical property fluctuation by utilizing the low temperature polycrystal-Si thin-film having the electron mobility of 260 to 500 $[cm^2/Vs]$. Therefore, the circuit for amplifying purpose such as the buffer amplifier in the related art can be partly eliminated and thereby an image display apparatus having large image display area can be attained. Moreover, there is a merit that such apparatus can be manufactured with less number of processes using the low cost glass substrate.

Figure 10A:
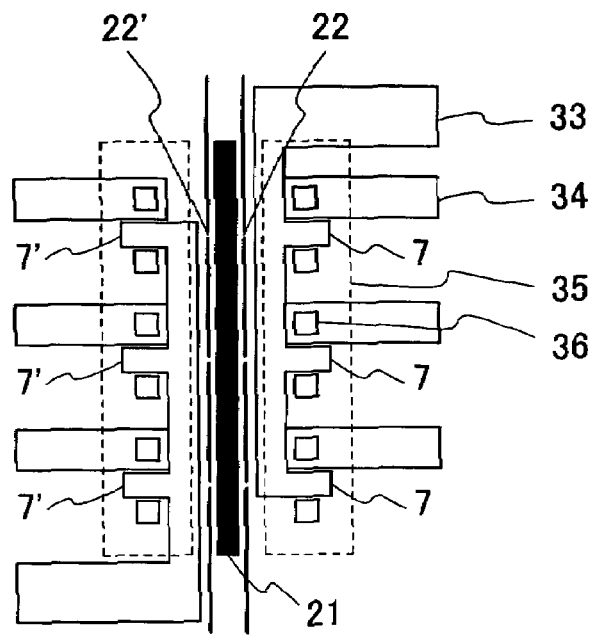
FIGS. 10A and 10B are plan views of the essential portion of a thin-film integrated circuit device of the present invention.
Figure 10B:
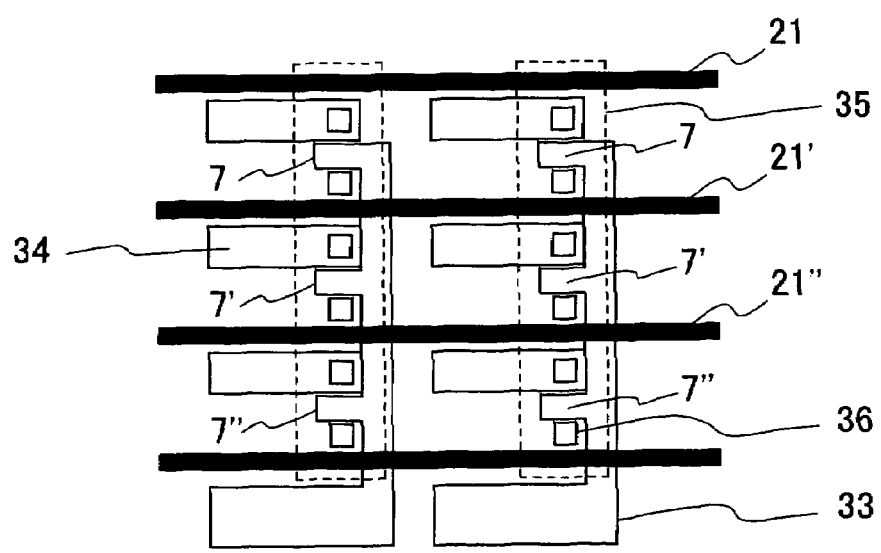

FIGS. 10A and 10B illustrate the plan views of the pattern formation examples of the semiconductor thin-film integrated circuit device for peripheral circuit to be formed on the glass substrate in the present invention.

FIG. 10A illustrates an example where the devices in FIG. 5A of the embodiment 5 are assembled in the higher integration density. In this example, the seed crystal metal pattern 21 is formed with the gate pattern 33, source pattern 34 and drain pattern 35. The channel part of each transistor is continuously crystallized in such a form as including twin-boundary with the seed crystal metal 21. As explained in regard to FIG. 5A and FIG. 5B, it is enough when the seed crystal metal 21 is provided among a plurality of TFT elements (more practical, between the gate electrodes 7 and 7' of element), namely on the semiconductor thin-film layer except for the channel forming area among the channel regions of a plurality of elements. Fluctuation of characteristics of many TFT elements can be reduced through the structure explained above.

As explained in regard to FIGS. 6A to 6D and FIGS. 7A to 7D, the crystallization characteristic can be improved by providing a plurality of squeezed portions 22, 22' to the semiconductor thin-film layer between the seed crystal metal 21 and TFT element.

FIG. 10B illustrates an example where the devices in FIG. 5C of the embodiment 5 are assembled with the higher integration density. This example can be adopted when the branch crystal is mainly used as the channel.

The above patterns are only an example and many patterns can be used depending on FIGS. 5A to 5F of the embodiment 5. The detail explanation is omitted here because the structure is similar to that of FIG. 10A, except for a plurality of seed crystal metals 21, 21', 21" are provided.

Various embodiments of the present invention have been explained on the basis of the thin-film semiconductor element wherein the gate, source and drain electrodes are arranged on the upper surface of the semiconductor layer. However, the present invention is not limited to such element and can also be adapted to a thin-film semiconductor element of the other structure and a thin-film semiconductor integrated circuit device using the same element.

Figure 11A:
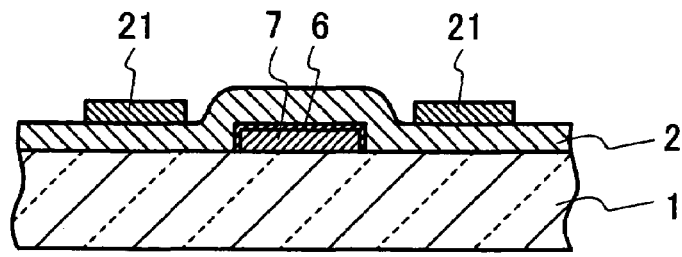
FIGS. 11A through 11D are cross-sectional views for explaining the essential portion of the other TFT of the present invention.
Figure 11B:
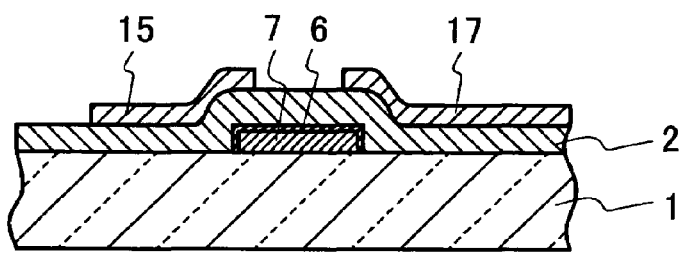

FIGS. 11A through 11D illustrate the cross-sectional views of the relevant thin-film semiconductor element. As illustrated in FIG. 11A, a gate electrode 7 is provided at the upper part of the insulator 1, a gate insulator 6 is provided on the surface thereof, a semiconductor layer 2 is deposited thereon and the seed crystal metal layer 21 is provided on the semiconductor layer of the peripheral part except for the semiconductor layer forming the channel part (active region) Thereafter, as illustrated in FIG. 11B, lateral crystallization is performed from the seed crystal metal layer through the heat treatment and thereby the channel part facing to the gate electrode is formed of a plurality of crystal grains joined with the twin-boundary. Thereafter, the crystal growth metal layer is removed and the source and drain electrodes 15, 17 are provided. In such element structure, after the gate oxide film that requires comparatively higher heat treatment is formed and semiconductor film is deposited and crystallization thereof is performed. Accordingly, the polycrystalline layer having the predetermined characteristic can be formed freely with excellent controllability. Moreover, since the semiconductor layers are deposited in multiple layers and crystal characteristic may be improved easily under the condition that the flatness of the element surface is well maintained, the thin-film semiconductor device having excellent characteristic can be manufactured rather easily.

Figure 11C:
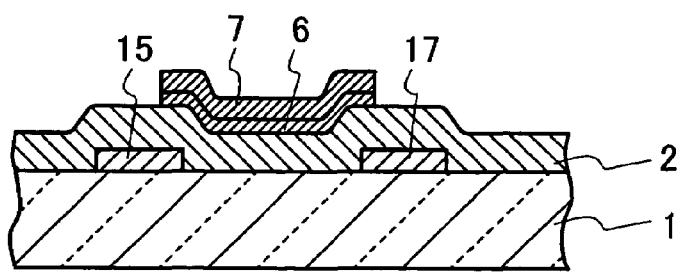

FIG. 11C illustrates a thin-film semiconductor device where the source and drain electrodes 15, 17 are provided on the insulator, the semiconductor layer 2 is deposited thereon and the gate electrode 7 is provided thereon via the gate insulator 6. In this case, it is also possible to use the seed crystal metal material as in the case of the FIG. 5D as the gate electrodes 15, 17 or to deposit such metal layer on the upper surface of the semiconductor layer 2 other than the channel forming area of FIG. 11A.

Figure 11D:
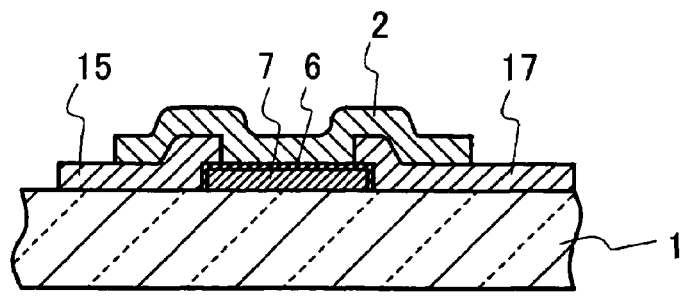

In the thin-film semiconductor device of FIG. 11D, the gate electrode 7 is provided on the insulator 1, the source electrode 15 and drain electrode 17 are provided via the insulator substrate and the semiconductor layer 2 is formed on the gate electrode via the gate insulator 6. In this case, the present invention can also be adapted as explained above. However, in this case, as explained in regard to FIGS. 11A and 11B, after the gate insulator is formed, deposition and crystallization of the semiconductor thin-film can be performed. Moreover, since the crystallization process may be performed after the source and drain electrodes that require comparatively low resistance characteristic are formed, fine control may be performed easily for the heat treatment of the semiconductor layer in comparison with the other type thin-film device.

In each embodiment of the present invention explained above, the field effect transistor (FET) is used, but the other semiconductor elements (for example, bipolar element, high electron mobility element (HEMT), optical power generating element or the like), if these have the semiconductor area of the present invention for use as the active region, may be utilized to form the high function and/or high performance semiconductor device and its composite integrated device through introduction of the present invention.

According to the present invention, since the low temperature polycrystal-Si that is used as the material of the thin-film semiconductor device is crystallized in the uniform orientation alignment (quasi single crystallization) and density of the dangling bond at the lattice joint in the grain boundary may be minimized, the electron mobility can be set as large as that of the single crystal Si (260 to 500 [cm$^2$/Vs]). Moreover, the thin-film semiconductor integrated circuit device that assures small characteristic fluctuation can be manufactured in a higher manufacturing yield. Thereby, it is now possible to integrally form the matrix element and peripheral circuit part as one or a plurality of thin-film semiconductor integrated circuit devices on the same glass substrate, and an image display apparatus having a large image display area (diagonal line length of display image is 15 inches or more) and substantially assuring uniform high image quality can be realized.

What is claimed is:

1. A thin-film semiconductor device comprising an insulator, a polycrystalline layer formed on said insulator, and a transistor comprising a source region, a drain region, and a channel region formed at a surface portion of said polycrystalline layer, and a gate electrode overlying said surface portion, said polycrystalline layer comprising crystal grains of an element selected from the group of Type-IV elements and alloys thereof, said crystal grains joined with crystal grain boundaries of {111} twin of Diamond structure, wherein said polycrystalline layer has a structure where a total of n-layers (n is 2 or larger) of semiconductor thin film are laminated, said source region, drain region, and channel region are formed at the surface of the uppermost semiconductor thin film of the n-layers of semiconductor thin film, and the gate electrode is formed at a surface of a gate insulator formed at the uppermost semiconductor thin film, the k-th (k=1 to n) semiconductor thin film has poly-crystals having a larger crystal grain size as the value of k increases and the grain boundary of the uppermost semiconductor thin film has the {111} twin of Diamond structure.

2. A thin-film semiconductor device comprising an insulator, a semiconductor thin-film formed on said insulator, and a transistor comprising a source region, a drain region, and a channel region formed at the surface of said semiconductor thin-film, and a gate electrode formed at the surface of a gate insulator formed at the surface of said semiconductor thin-film, said semiconductor thin-film having amorphous regions of Type-IV element and dendrite crystal regions of Type-IV element connecting said source region and said drain region, wherein said semiconductor thin-film has a structure where a total of n-layers (n is 2 or larger) of semiconductor thin film are laminated, said source region, said drain region, and said channel region are formed at the surface of the uppermost semiconductor thin film of the n-layers of semiconductor thin film, and said gate electrode is formed at the surface of a gate insulator formed at the uppermost semiconductor thin film, the k-th (k=1 to n) semiconductor thin-film increases width and length of dendrite crystal as the value of k increases, and the grain boundary of the uppermost semiconductor thin-film has {111} twin of Diamond structure.

* * * * *